(12) United States Patent
Greene et al.

(10) Patent No.: US 7,507,631 B2
(45) Date of Patent: Mar. 24, 2009

(54) EPITAXIAL FILLED DEEP TRENCH STRUCTURES

(75) Inventors: Brian Joseph Greene, Yorktown Heights, NY (US); Judson Robert Holt, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 364 days.

(21) Appl. No.: 11/428,983

(22) Filed: Jul. 6, 2006

(65) Prior Publication Data

US 2008/0009109 A1    Jan. 10, 2008

(51) Int. Cl.
*H01L 21/336* (2006.01)

(52) U.S. Cl. ............... 438/270; 438/271; 438/173; 438/416; 438/429; 257/E21.06; 257/E21.262

(58) Field of Classification Search ............. 438/173, 438/270–271, 416, 429
See application file for complete search history.

(56) References Cited

U.S. PATENT DOCUMENTS 7,071,103 B2 *    7/2006   Chan et al. .............. 438/653

\* cited by examiner

*Primary Examiner*—Michelle Estrada
*Assistant Examiner*—Jarrett J Stark
(74) *Attorney, Agent, or Firm*—Schmeiser, Olsen & Watts; Steven Capella

(57) ABSTRACT

A method of forming and a structure of an electronic device. The method including: forming a trench in a single-crystal semiconductor substrate; forming a dopant diffusion barrier layer on sidewalls and a bottom of the trench; and epitaxially growing a single-crystal semiconductor layer in the trench, the single-crystal semiconductor layer filling the trench, the dopant diffusion barrier layer a barrier to diffusion of semiconductor dopants. Also a power transistor formed by the same method.

1 Claim, 9 Drawing Sheets

EPITAXIAL FILLED DEEP TRENCH STRUCTURES

FIELD OF THE INVENTION

The present invention relates to the field of semiconductor structures and fabrication methods and more specifically, it relates to deep trench semiconductor structures and methods of fabricating deep trench semiconductor trenches.

BACKGROUND OF THE INVENTION

There are many potential uses for epitaxial filled trench structures; however two problems arise in the fabrication of epitaxial filled deep trenches. The first problem is currently not possible to produce high quality single-crystal semiconductor filled trenches that do not include dopants that have diffused into the trench material from the substrate or diffuse out of the trench into the substrate. Such dopant diffusions can adversely affect device parametrics. The second problem is stresses in the crystal structure of the trench material caused by the epitaxial growth process can also adversely affect device parametrics. Therefore, there is a need for an epitaxial filled trench structure and method of fabricating epitaxial filled trench structures with controlled dopant and stress levels.

SUMMARY OF THE INVENTION

A first aspect of the present invention is a method of forming an electronic device, comprising: forming a trench in a single-crystal semiconductor substrate; forming a dopant diffusion barrier layer on sidewalls and a bottom of the trench; and epitaxially growing a single-crystal semiconductor layer in the trench, the single-crystal semiconductor layer filling the trench, the dopant diffusion barrier layer a barrier to diffusion of semiconductor dopants.

A second aspect of the present invention is an electronic device, comprising: a trench in a single-crystal semiconductor substrate; a dopant diffusion barrier layer on sidewalls and a bottom of the trench; and a single-crystal semiconductor layer in the trench, the single-crystal semiconductor layer filling the trench, the dopant diffusion barrier layer a barrier to diffusion of semiconductor dopants.

A third aspect of the present invention is a method of forming an electronic device, comprising: forming a set of first parallel trenches in a single-crystal silicon substrate of a first dopant type; forming a dopant diffusion barrier layer on sidewalls and bottoms of the first trenches; epitaxially growing a first single-crystal silicon layer of a second dopant type in the first trenches, the single-crystal silicon layer filling the trenches, the dopant diffusion barrier layer a barrier to diffusion of semiconductor dopants; co-planarizing top surfaces of the silicon substrate and the first silicon layer; epitaxially growing a second single-crystal silicon layer of the first dopant type on the top surfaces of the silicon substrate and the first silicon layer; forming a set of second parallel trenches in the second silicon layer, the second trenches orthogonal to the first trenches; forming a gate dielectric layer on sidewalls and bottoms of the second trenches; filling the second trenches with an electrical conductor; and forming diffused regions of the first dopant type in the second silicon layer, the diffused regions adjacent to the gate dielectric layer on the sidewalls of the second trenches and to a top surface of the second silicon layer, the diffused regions not contacting the first silicon layer, and the diffused regions extending along the lengths of the second trenches.

A fourth aspect of the present invention is an electronic device, comprising: a set of first parallel trenches in a single-crystal silicon substrate of a first dopant type; a dopant diffusion barrier layer on sidewalls and bottoms of the first trenches; a first single-crystal silicon layer of a second dopant type in the first trenches, the single-crystal silicon layer filling the trenches, the dopant diffusion barrier layer a barrier to diffusion of semiconductor dopants; a second single-crystal silicon layer of the first dopant type on co-planar top surfaces of the silicon substrate and the first silicon layer; a set of second parallel trenches in the second silicon layer, the second trenches orthogonal to the first trenches; a gate dielectric layer on sidewalls and bottoms of the second trenches; an electrical conductor filling the second trenches; and diffused regions of the first dopant type in the second silicon layer, the diffused regions adjacent to the dielectric layer on the sidewalls of the second trenches and to a top surface of the of the second silicon layer, the diffused regions not contacting the first silicon layer, and the diffused regions extending along the lengths of the second trenches.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Epitaxial growth should not be confused with poly-crystalline growth. Epitaxial growth occurs on crystalline materials and results in a continuation of the crystal structure into the epitaxial layer as the epitaxial layer grows. An example is the growth of an epitaxial or single-crystal layer of silicon on a single-crystal silicon substrate. Poly-crystalline growth occurs on amorphous materials and results in a layer comprised of a jumble of micro-crystals formed on the amorphous material. An example of poly-crystalline growth is the formation of polysilicon on silicon dioxide or silicon nitride layers.

Figure 1A:
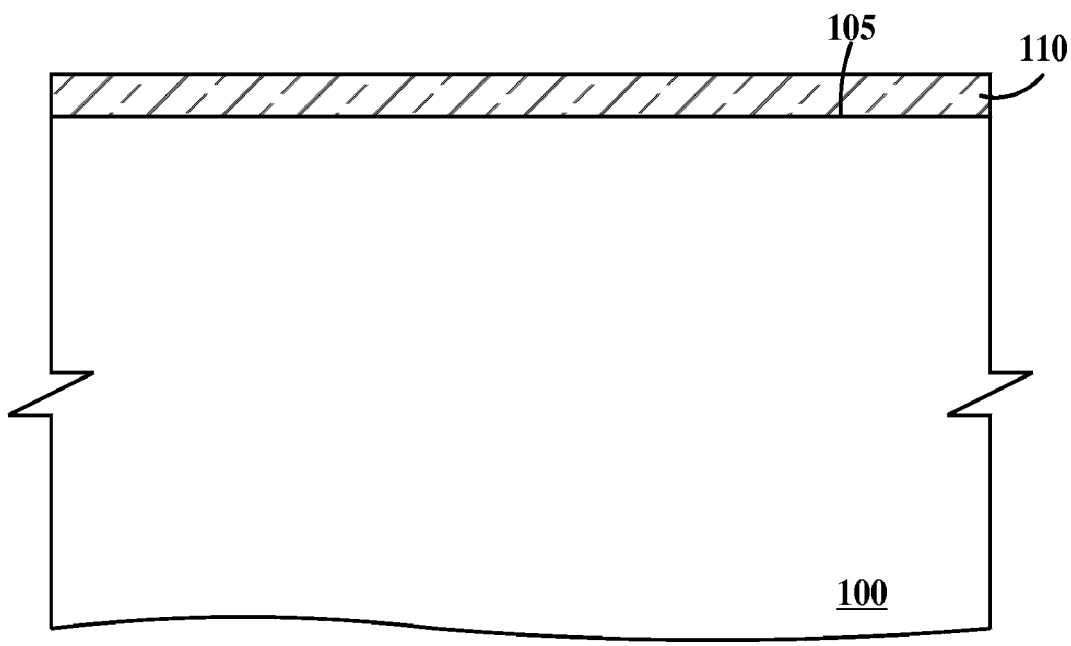
FIGS. 1A through 1D are cross-section drawings illustrating fabrication of a deep trench in a substrate according to embodiments of the present invention.

FIGS. 1A through 1D are cross-section drawings illustrating fabrication of a deep trench in a substrate according to embodiments of the present invention. In FIG. 1A, a single-crystal substrate 100 has a top surface 105. Formed on top surface 105 of substrate 100 is a hard mask layer 110. In one example, substrate 100 is silicon or the upper single-crystal silicon layer of a silicon-on-insulator (SOI) substrate. In one example, hard mask layer 110 comprises silicon dioxide, silicon nitride or a combination of layers thereof.

Figure 1B:
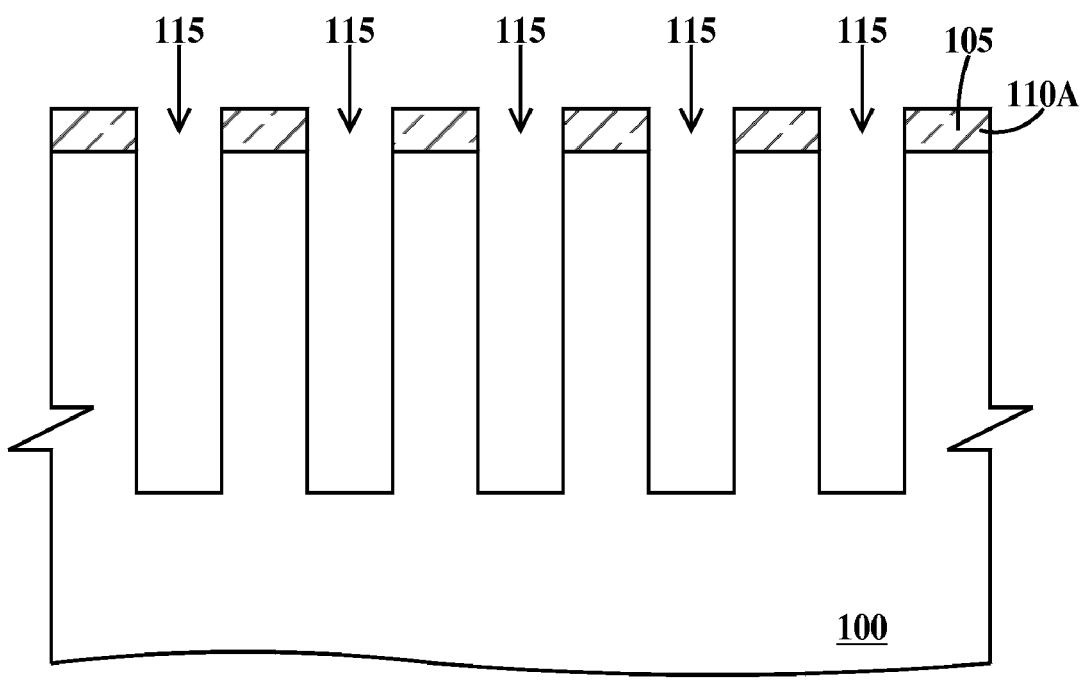

In FIG. 1B, a pattern has been formed in hard mask layer 110 (see FIG. 1A) to generate a patterned hardmask layer 110A. Then, a silicon etch is performed, forming trenches 115 in silicon substrate 100 wherever the substrate is not protected by patterned hardmask layer 110A. Patterned, hardmask layer 110A may be formed by forming a layer of photoresist on hardmask layer 110 (see FIG. 1A), exposing the photoresist to actinic radiation through a patterned photomask, developing away the exposed or unexposed photoresist regions (depending upon the polarity of the photoresist), etching the hardmask layer to expose substrate 100 wherever the hardmask layer is not protected by photoresist and then removing the photoresist. Trenches 115 have a depth D and a width W. Etching of hard mask layer 110 (see FIG. 1A) may be down by wet etching or reactive ion etching (RIE). Trenches 115 may be formed by wet etching or RIE of substrate 100. Trenches with high aspect ratios (depth to width of 5 more) may advantageously be formed by RIE. In one example, D/W is equal to greater than 10. In one example W is equal to about 1000 Å and D is equal to about 10,000 Å.

Figure 1C:
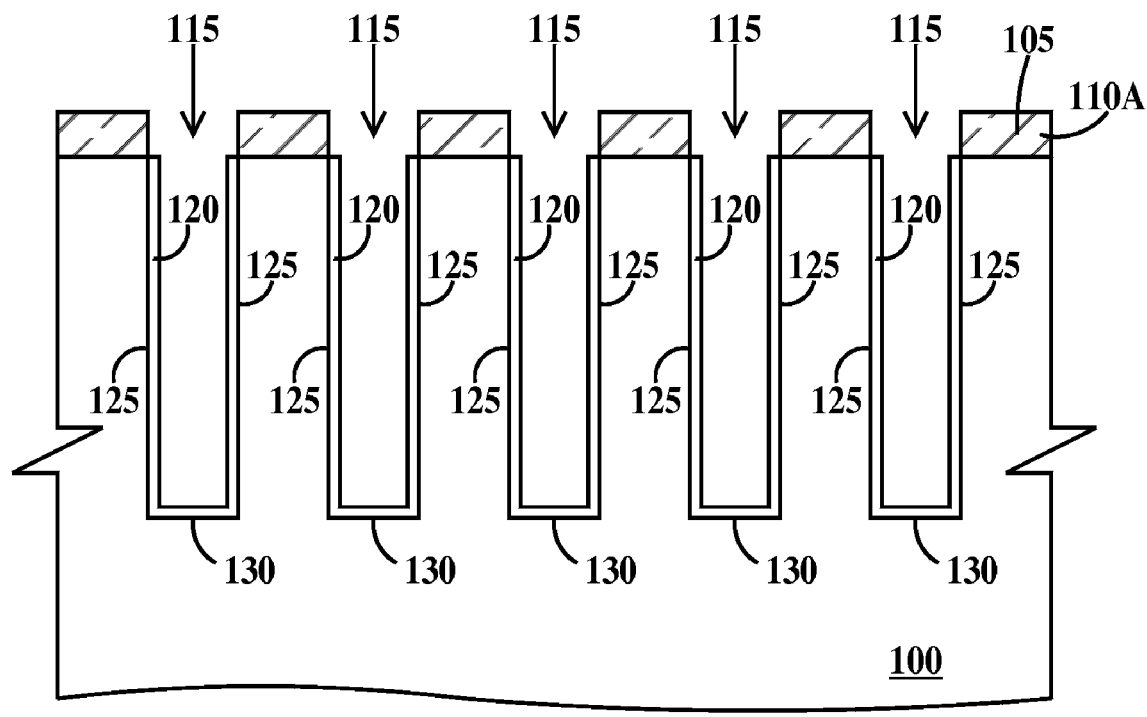

In FIG. 1C, a diffusion barrier layer 120 is formed on sidewalls 125 and bottoms 130 of trenches 115. While patterned hardmask layer 110A has been left in place in FIG. 1D to serve as a polish stop in subsequent processing described infra, patterned hardmask 110A may be removed prior to formation of diffusion barrier layer 120. Diffusion barrier 120 is a diffusion barrier to semiconductor dopants of groups III and V such as boron, phosphorous, arsenic and antimony. However, diffusion barrier layer 120 is not a significant barrier to electron flow, i.e. the current flow between two semiconductor layers in direct physical contact (without any diffusion barrier) is about the same as a current flow between the same two layers when each layer is physically contacting a opposite side of the diffusion barrier layer (with the diffusion barrier layer in-between). Normal electron flow excludes tunneling electron flow. Three examples of the composition and formation of diffusion barrier layer 120 will be given.

In a first example, diffusion barrier layer 120 comprises a mono-layer of carbon and oxygen and may be formed by the following process:

Clean exposed surfaces of trenches 115 with one or more of a sulfuric acid/hydrogen peroxide mixture, an ammonium hydroxide/hydrogen peroxide mixture and a hydrochloric acid/hydrogen peroxide mixture;

(2) Form Si—H terminations on the clean surfaces using aqueous or alcoholic hydrofluoric acid, an aqueous or alcoholic ammonium hydroxide/hydrofluoric acid mixture or hydrofluoric acid vapor;

(3) Replace the Si-termination with Si—O—R (where R is an alky group) termination by immersion in or spray application of a between about 1E-3 molar and 1E-5 molar iodine in alcohol solution, where the alcohol is selected from the group consisting of methanol, ethanol, n-propanol, isopropanol, butanol, pentanol, heptanol, octanol, nanonol, and mixtures thereof. Methanol and ethanol are preferred; and (4) Rinsing in alcohol.

The formation of S—H and Si—O—R terminations is suppositional and should not be considered as limiting the operation of the invention or the claims.

In a second example, diffusion barrier layer 120 comprises a layer of carbon containing epitaxial (single-crystal) silicon between about 10 Å and about 500 Å thick grown directly on sidewalls 125 and bottoms 130 of trenches 115. This layer may be formed by low-pressure chemical vapor deposition (LPCVD) at between about 5 and about 40 torr and between about 750° C. and about 950° C. using, for example silane and ethane as precursor gases.

In a third example, diffusion barrier layer 120 comprises a layer of carbon containing epitaxial (single-crystal) silicon-germanium (SiGe) between about 10 Å and about 500 Å thick grown directly on sidewalls 125 and bottoms 130 of trenches 115. The epitaxial SiGe layer may be formed by low-pressure chemical-vapor-deposition (LPCVD) at between about 5 and about 40 torr and between about 750° C. and about 950° C. using, for example silane, germane and ethane as precursor gases.

In a fourth example, diffusion barrier layer 120 comprises the layer of carbon containing epitaxial silicon between about 10 Å and about 500 Å thick described supra and the layer of carbon containing epitaxial SiGe between about 10 Å and about 500 Å thick described supra. Either the layer of carbon containing epitaxial silicon or the layer of carbon containing epitaxial SiGe may be grown first followed by the other.

Figure 1D:
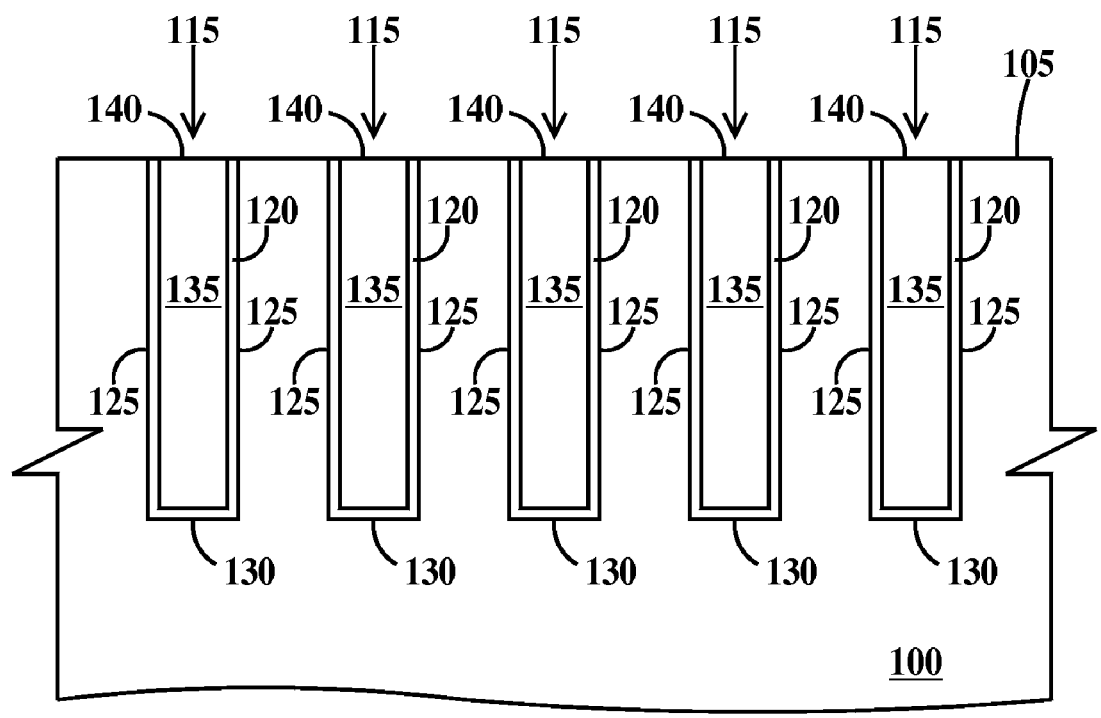

In FIG. 1D, single-crystal semiconductor material 135 is epitaxially grown in trenches 115, filling the trenches and a chemical-mechanical polish performed to co-planarize top surfaces 140 of semiconductor material 135 and top surface 105 of substrate 100. Semi-conductor material 135 may comprise, doped or undoped silicon, doped or undoped SiGe, doped or undoped carbon containing Si, doped or undoped carbon containing SiGe (SiGeC or $Si_{1-x-y}Ge_xC_y$) or layers thereof which may be formed by LPCVD, and ultra-low pressure CVD or plasma-enhanced CVD (PECVD) at pressures between about 0.1 torr and about 40 torr (dependant upon the CVD process) and between about 500° C. and about 1000° C. Suitable dopants for semiconductor material 135 include boron, phosphorus, arsenic and antimony introduced as diborane, phosphine, arsine and stibine into the CVD gas flow respectively. Alternatively, boron, phosphorus, arsenic and antimony may be introduced into semi-conductor material after deposition by ion implantation.

When $Si_{1-x-y}Ge_xC_y$ is used to fill trenches 115, the stress levels of the filled trenches may be controlled by varying the composition (x, y) as the deposition occurs. Since epitaxial growth of semiconductor material 135 will occur from the sidewalls and bottom of trenches 115 toward the centers of the trenches, the germanium percentage and thereby the degree of stress of semiconductor material 135 can be varied a function of distance from the sidewalls of the trench to a centerline of the trench, the centerline parallel to and equidistant from the sidewalls. In other words, a concentration of germanium in the carbon containing silicon-germanium can be made to vary as a function of distance from the sidewalls of the trench.

FIGS. 2A through 2G are cross-section drawings illustrating fabrication of a power transistor incorporating deep trenches according to embodiments of the present invention.

Figure 2A:
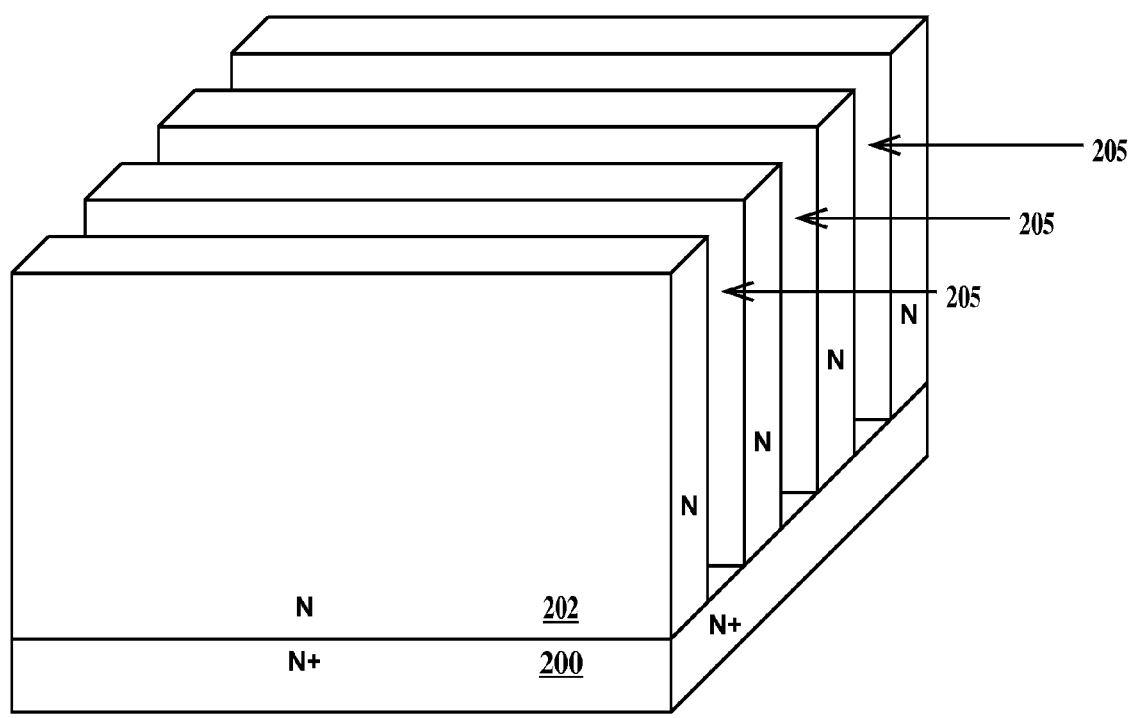
FIGS. 2A through 2G are cross-section drawings illustrating fabrication of a power transistor incorporating deep trenches according to embodiments of the present invention.

In FIG. 2A, formed on a highly doped (N+) single-crystal silicon substrate 200 is a N-doped single-crystal silicon layer 202. Trenches 205 are formed in silicon layer 202 as described supra in reference to FIG. 1B. Silicon substrate 200 is exposed in the bottoms of trenches 205 (as illustrated) or alternatively trenches 205 extend a short distance into silicon substrate 200. In one example, the N-type dopants of silicon substrate 200 and silicon layer 202 are independently chosen from the group consisting of phosphorus, arsenic and antimony. Silicon layer 202 may be formed by epitaxial growth by an LPCVD process using silane and a dopant-hydride gas. Silicon layer 220 may be formed LPCVD. Suitable N-type dopants for silicon layer 202 include phosphorous, arsenic and antimony, which may be introduced, respectively, as phosphine, arsine and stibine, into the LPCVD gas flow or by ion implantation after deposition of silicon layer 202.

Figure 2B:
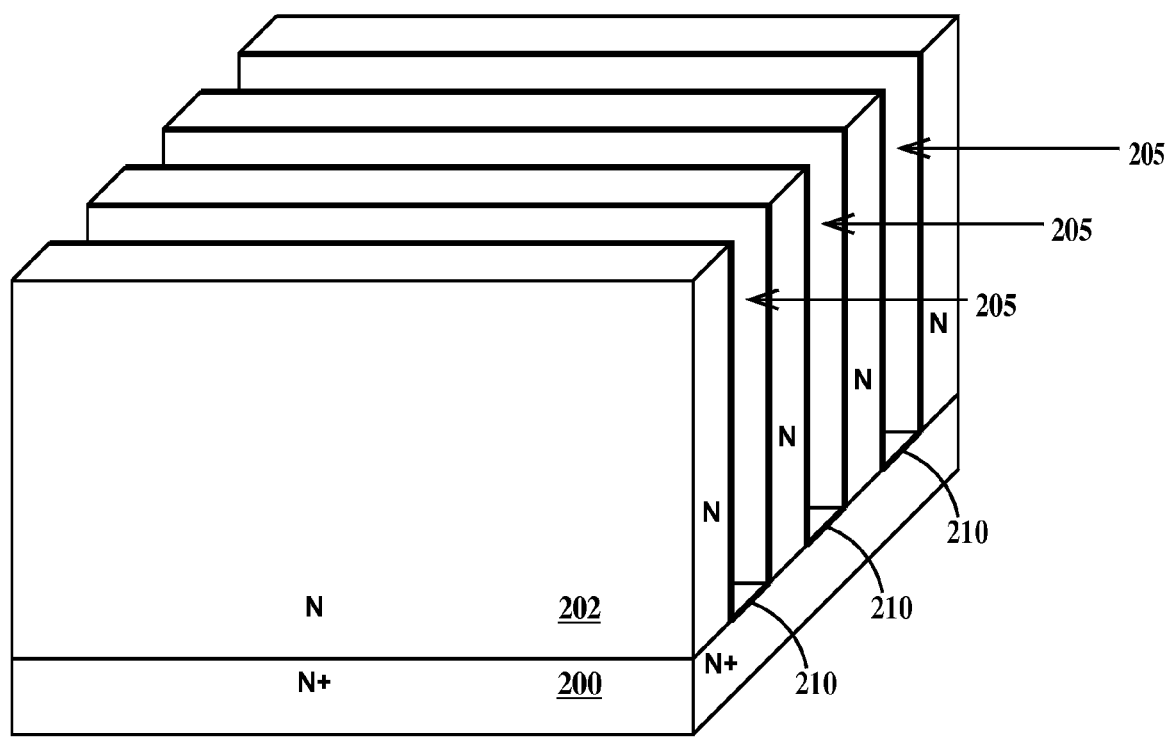

In FIG. 2B, a diffusion barrier layer 210 (heavy lines in FIG. 2B) is formed on exposed surfaces of silicon layer 202 and silicon substrate 200 including the sidewalls and bottoms of trenches 205 as described supra in reference to FIG. 1C.

Figure 2C:
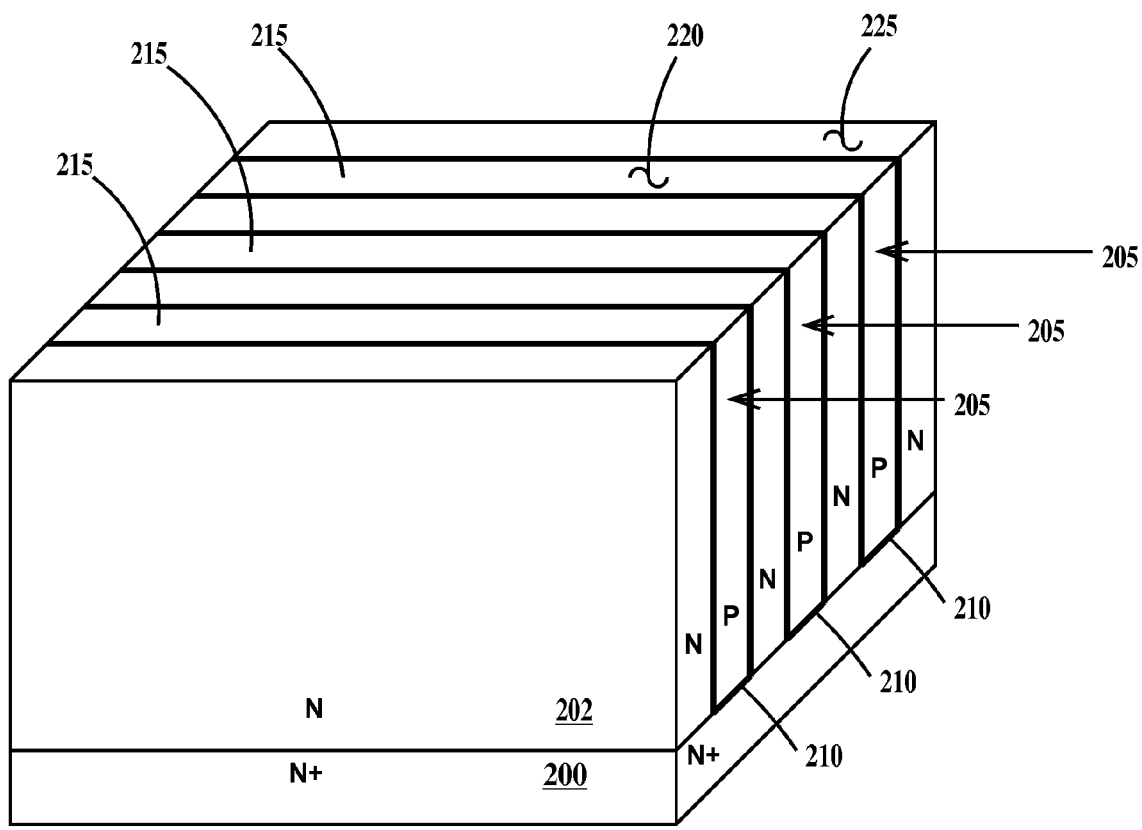

In FIG. 2C, single-crystal silicon 215 is epitaxially grown in trenches 205, filling the trenches and a chemical-mechanical polish performed to co-planarize top surfaces 220 of single-crystal silicon 215 and a top surface 225 of substrate 200. Single-crystal silicon 215 may be formed by LPCVD, and ultra-low pressure CVD or plasma-enhanced CVD (PECVD) at pressures between about 0.1 torr and about 40 torr (dependant upon the CVD process) and between about 750° C. and about 950° C. Suitable P-type dopants for single-crystal silicon 215 include boron, which may be introduced as diborane, into the CVD gas flow or by ion implantation as well as aluminum and indium, which may be introduced into single-crystal silicon 215 by ion implantation.

Because diffusion barrier layer 210 prevents or limits P-type dopants in single-crystal silicon 215 from diffusing into silicon substrate 200 and silicon layer 202 and N-type dopants in silicon substrate 200 and silicon layer 202 from diffusing into single-crystal silicon 215, abrupt junctions are created between single-crystal silicon 215 and silicon layer 202 along the sidewalls of trenches 205. If trenches 205 extend into silicon substrate 200, there will be some junction formed at the single-crystal silicon 215 and silicon substrate 200 boundary. This abrupt junction need not be a single sided abrupt junction where the acceptor (P-type) concentration is much greater than donor the (N-type) concentration ($N_A$>>$N_D$) or vice versa, but can be a two-sided abrupt junction of relatively low or about equal dopant concentrations on either side of the junction.

Figure 2D:
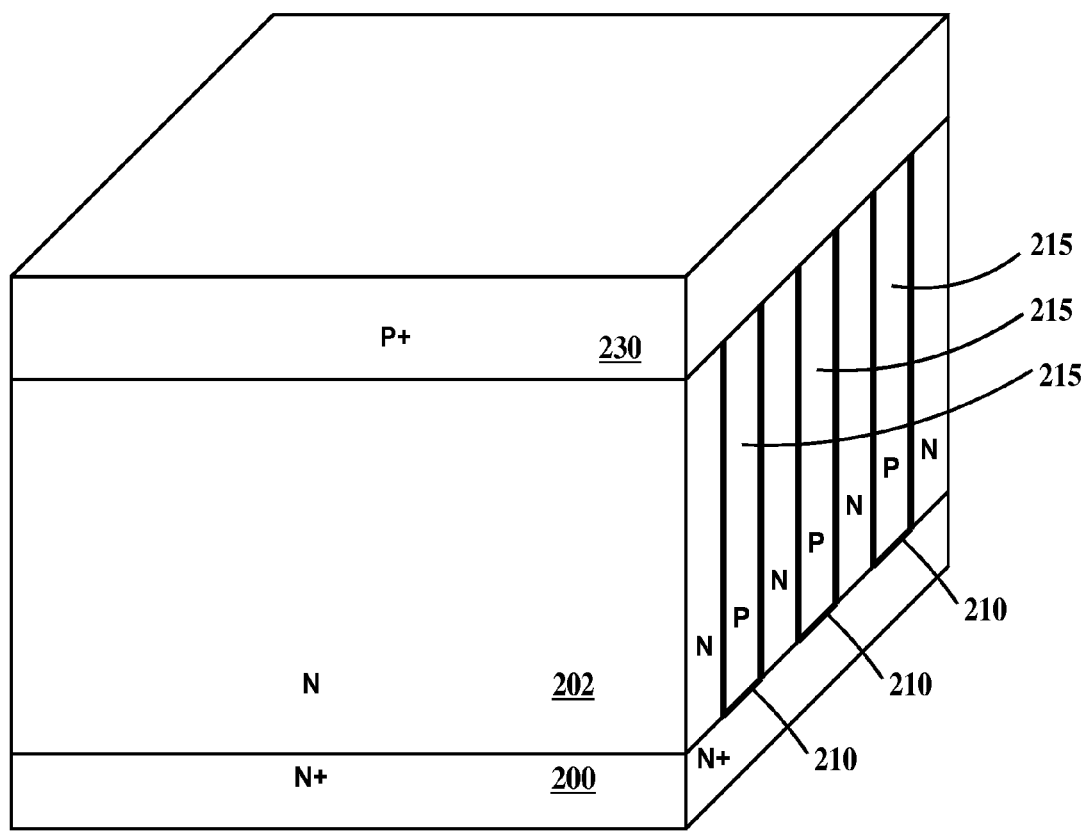

In FIG. 2D, a highly doped (P+) type single-crystal silicon layer 230 is formed on top of silicon layer 202 and single-crystal silicon 215. Silicon layer 230 may be formed LPCVD. Suitable P-type dopants for silicon layer 215 include boron, which may be introduced as diborane, into the LPCVD gas flow or by ion implantation as well as aluminum and indium, which may be introduced into silicon layer 230 by ion implantation.

Figure 2E:
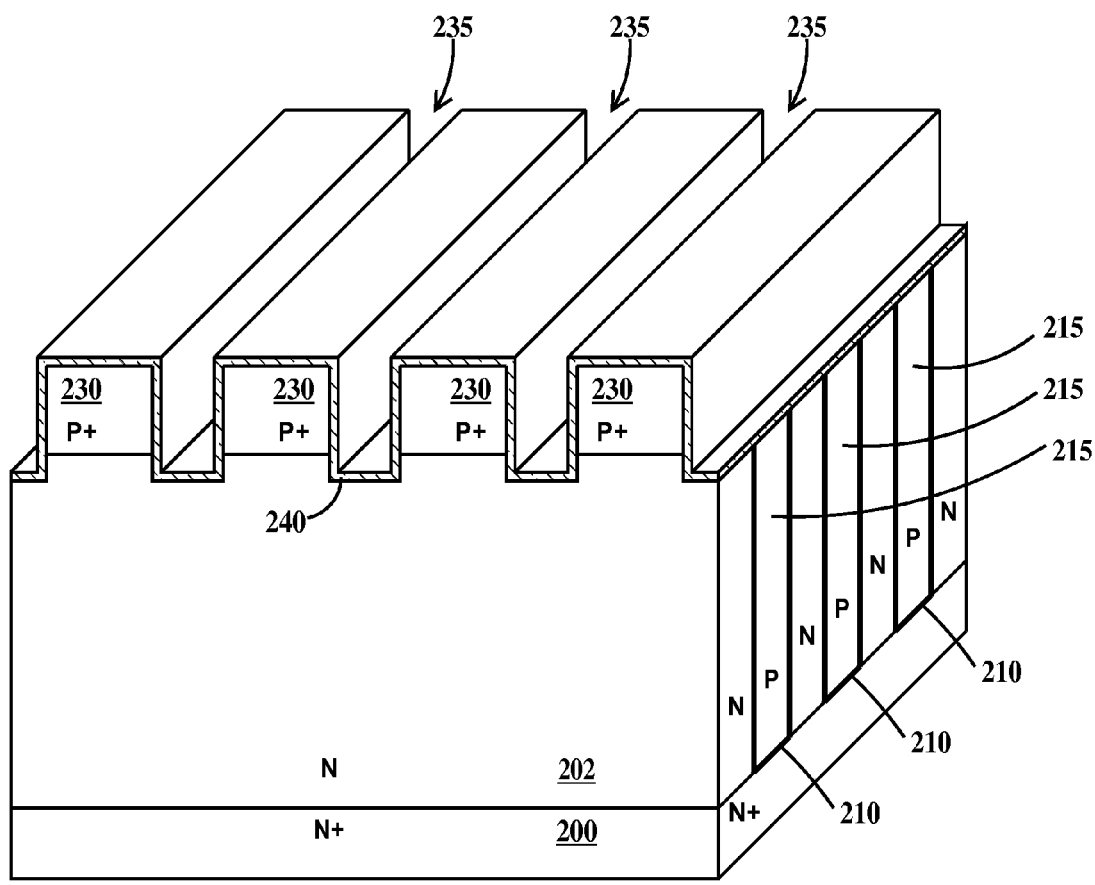

In FIG. 2E, trenches 235 are formed in silicon layer 230. Silicon layer 202 is exposed in the bottom of trenches 235. Trenches 235 may extend into silicon layer 202 as illustrated in FIG. 2E or just abut silicon layer 202. Trenches 235 are formed orthogonal to trenches 215. Trenches 235 may be formed as described supra in reference to FIG. 1B. A gate dielectric layer 240 is then formed on the sidewalls and bottom s of trenches 235. In one example gate dielectric layer 240 is silicon dioxide, silicon nitride or a combination of layers thereof. In one example gate dielectric layer 240 is a high K (dielectric constant) material, examples of which include but are not limited to metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high K dielectric material has a relative permittivity above about 10. In one example, gate dielectric layer 240 is about 0.5 nm to 20 nm thick.

Figure 2F:
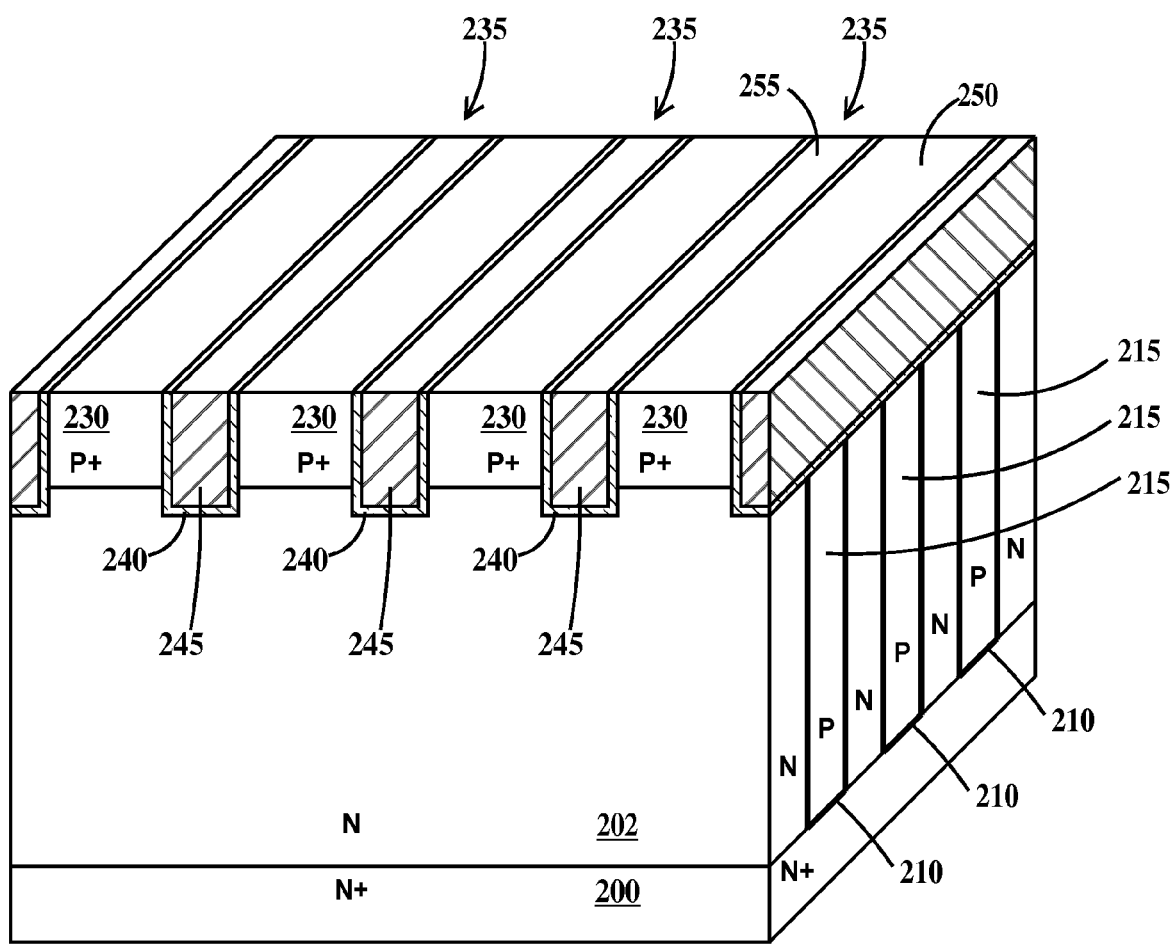

In FIG. 2F, trenches 245 are filled with doped or undoped polysilicon or a metal to form gates 245 and a CMP performed to co-planarize respective top surfaces 250 and 255 of silicon layer 230 and gates 245.

Figure 2G:
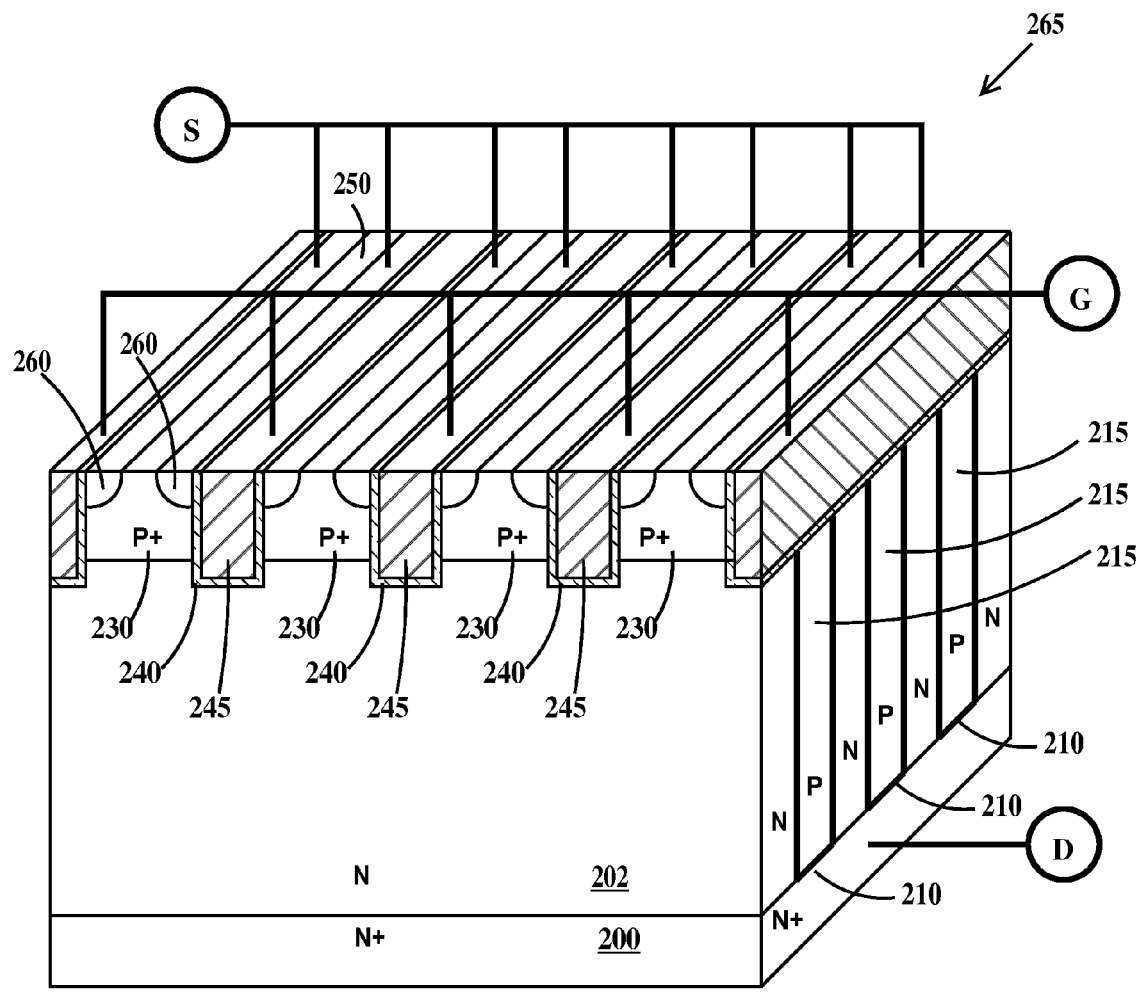

In FIG. 2G, N-doped regions 260 are formed in silicon layer 230 adjacent to both top surface 250 of silicon layer 230 and gate dielectric layer 240 on both sides of gates 245. Doped regions 260 extend lengthwise parallel to gates 245. Electrical connections to power transistor 265 are illustrated schematically. A source contact (S) is made to doped regions 160, a gate contact (G) to gates 245 and a drain contact (D) to silicon substrate 200. Physically, the source, gate and drain contacts may be fabricated by any number of processes known in the art.

Thus, the embodiments of the present invention provide an epitaxial filled trench structure and method of fabricating epitaxial filled trench structures with controlled dopant and stress levels.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of forming an electronic device, comprising:
    forming a set of first parallel trenches in a single-crystal silicon substrate of a first dopant type;
    forming a dopant diffusion barrier layer on sidewalls and bottoms of said first trenches by applying an alcoholic iodine solution to said sidewalls and bottom of said first trenches, said dopant diffusion barrier layer comprising a mono-layer comprising carbon and oxygen on said sidewalls and bottom of said trench;
    epitaxially growing a first single-crystal silicon layer of a second dopant type in said first trenches, said single-crystal silicon layer filling said trenches, said dopant diffusion barrier layer a barrier to diffusion of semiconductor dopants;
    co-planarizing top surfaces of said silicon substrate and said first silicon layer;
    epitaxially growing a second single-crystal silicon layer of said first dopant type on said top surfaces of said silicon substrate and said first silicon layer;
    forming a set of second parallel trenches in said second silicon layer, said second trenches orthogonal to said first trenches;
    forming a gate dielectric layer on sidewalls and bottoms of said second trenches;
    filling said second trenches with an electrical conductor;
    forming diffused regions of said first dopant type in said second silicon layer, said diffused regions adjacent to said gate dielectric layer on said sidewalls of said second trenches and to a top surface of said second silicon layer, said diffused regions not contacting said first silicon layer, and said diffused regions extending along the lengths of said second trenches; and
    wherein said semiconductor substrate is silicon and said semiconductor layer is selected from the group consisting of a doped or undoped silicon layer, a doped or undoped silicon-germanium layer, a doped or undoped carbon containing silicon layer, a doped or undoped carbon containing silicon-germanium and combinations thereof; and
    wherein a concentration of germanium in said doped or undoped carbon containing silicon-germanium layer varies as a function of distance from said sidewalls of said trench to a centerline of said trench, said centerline parallel to and equidistant from said sidewalls.

* * * * *